United States Patent
Pan et al.

(10) Patent No.: US 7,064,557 B2
(45) Date of Patent: Jun. 20, 2006

(54) CALIBRATION CIRCUIT AND METHOD FOR FILTER BANDWIDTH WHICH IS PARASITIC CAPACITANCE SENSITIVE OR INSENSITIVE

(75) Inventors: Meng-An Pan, Cerritos, CA (US); Stephen Wu, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 134 days.

(21) Appl. No.: 10/800,713

(22) Filed: Mar. 16, 2004

(65) Prior Publication Data

US 2005/0240368 A1 Oct. 27, 2005

(51) Int. Cl.
*H03H 7/00* (2006.01)
*G01R 35/00* (2006.01)
*G01R 23/165* (2006.01)

(52) U.S. Cl. .................. 324/619; 324/601; 324/606; 333/174

(58) Field of Classification Search ............. 324/76.44, 324/76.45, 601, 619, 522, 606, 523; 333/17.1, 333/174; 455/339
See application file for complete search history.

(56) References Cited

U.S. PATENT DOCUMENTS

| | | | | |
|---|---|---|---|---|
| 3,644,835 A | * | 2/1972 | Thompson | 327/3 |
| 6,496,011 B1 | * | 12/2002 | Kloeckner | 324/500 |
| 6,573,811 B1 | * | 6/2003 | Martin | 333/172 |
| 2002/0190810 A1 | * | 12/2002 | Nystrom et al. | 333/17.1 |
| 2003/0042984 A1 | | 3/2003 | Shervin et al. | |

\* cited by examiner

*Primary Examiner*—Anjan Deb
(74) *Attorney, Agent, or Firm*—Squire, Sanders & Dempsey L.L.P.

(57) ABSTRACT

A calibration circuit and method causes a cutoff frequency to match the design frequency of low pass filter by adjusting a capacitor array in the low pass filter.

16 Claims, 4 Drawing Sheets

CALIBRATION CIRCUIT AND METHOD FOR FILTER BANDWIDTH WHICH IS PARASITIC CAPACITANCE SENSITIVE OR INSENSITIVE

BACKGROUND

1. Technical Field

This invention relates generally to wireless communication systems, and more particularly, but not exclusively, to calibrating filter bandwidth which is parasitic capacitance sensitive or insensitive.

2. Description of the Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channel pair (e.g., one of the plurality of radio frequency (RF) carriers of the wireless communication system) and communicate over that channel or channel pair. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, removes the RF carrier frequency from the RF signals directly or via one or more intermediate frequency stages, and demodulates the signals in accordance with a particular wireless communication standard to recapture the transmitted data. The transmitter converts data into RF signals by modulating the data to RF carrier in accordance with the particular wireless communication standard and directly or in one or more intermediate frequency stages to produce the RF signals.

Transmitters may also include low pass filters (LPFs) that filter out certain signals above a specific cutoff frequency in order to decrease noise or other undesirable signal aspects. However, due to process variations in the manufacturing process or other reasons, the cutoff frequency of an LPF may vary from the specified cutoff frequency, cutting off a desirable portion of a signal or not cutting off enough of an undesirable portion of a signal.

Accordingly, a new circuit and method is required that compensates variations between a desired cutoff frequency (i.e., original design frequency) and the actual cutoff frequency for filter bandwidth with parasitic capacitance sensitive or insensitive.

SUMMARY

Embodiments of the invention move a cutoff frequency of a low pass filter to the design cutoff frequency to correct for differences caused by process variation in manufacturing or other reasons.

In an embodiment of the invention, a method comprises: measuring a difference in voltage between a first and second element of a filter when an equal current is applied to both elements; and adjusting at least one of the first or second elements if there is a measured difference in voltage. The adjusting causes a characteristic of the filter to more closely match a design characteristic of the filter. The method can be repeated until an acceptable (pre-specified) difference is achieved (e.g., within a margin of error for voltage measurements).

In an embodiment of the invention, a system (e.g., circuit) comprises a comparator and an engine. The comparator measures a difference in voltage between a first and second element of a filter when an equal current is applied to both elements. The engine, which is communicatively coupled to at least one of the first and second elements and communicatively coupled to the comparator, adjusts at least one of the first or second elements if there is a measured difference in voltage. The adjusting causes a characteristic of the filter to more closely match a design characteristic of the filter.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
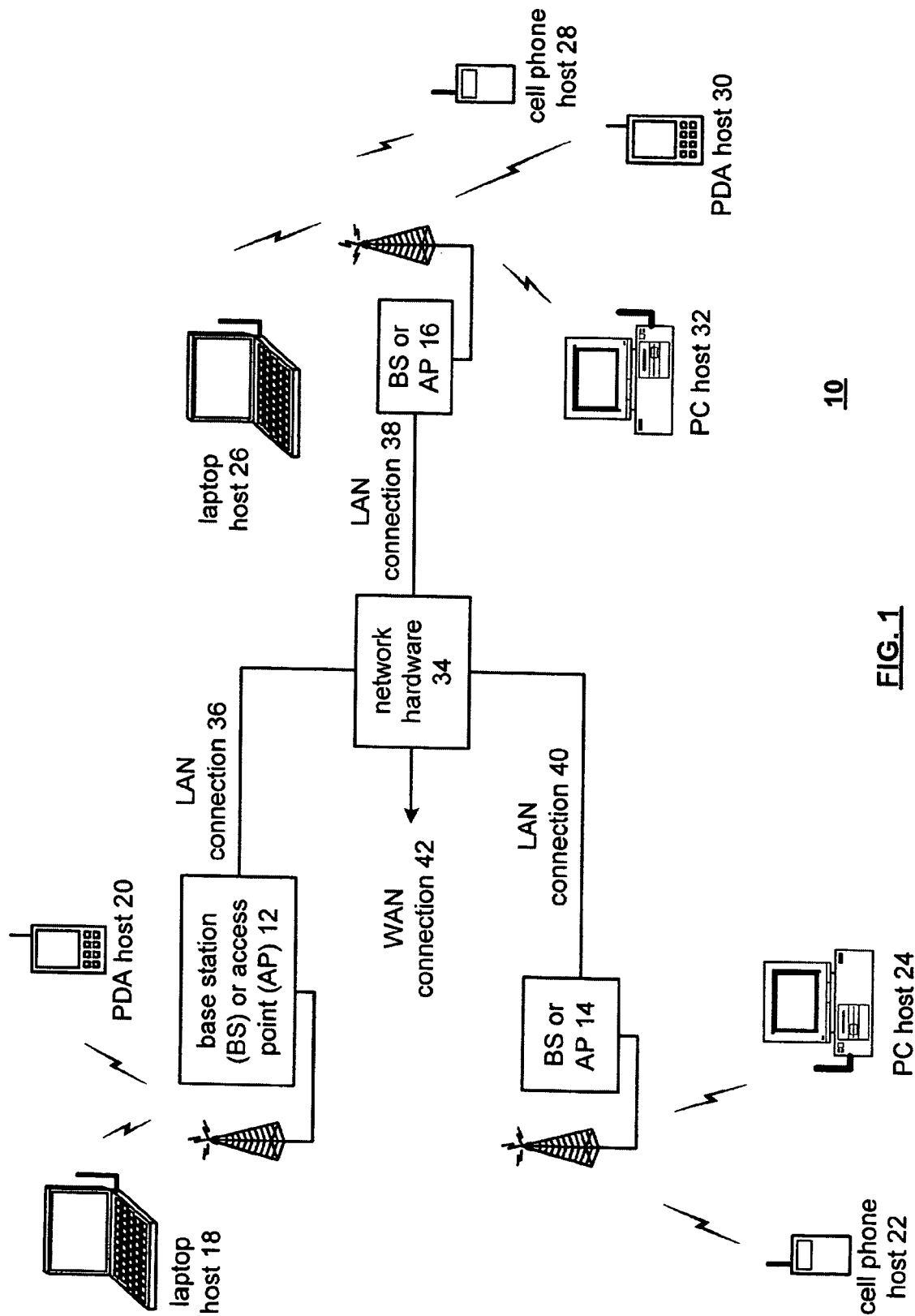
FIG. 1 is a block diagram illustrating a network system according to an embodiment of the present invention.

FIG. 1 is a block diagram illustrating a network system 10 according to an embodiment of the present invention. The system 10 includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28.

The base stations or access points 12 are operably coupled to the network hardware 34 via local area network connections 36, 38 and 40. The network hardware 34, which may be a router, switch, bridge, modem, system controller, etc. provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a transmitter capable of adjusting power amplifier output power and therefore has characteristics of reduced power requirements, thereby extending the life of an associated power supply.

Figure 2A:
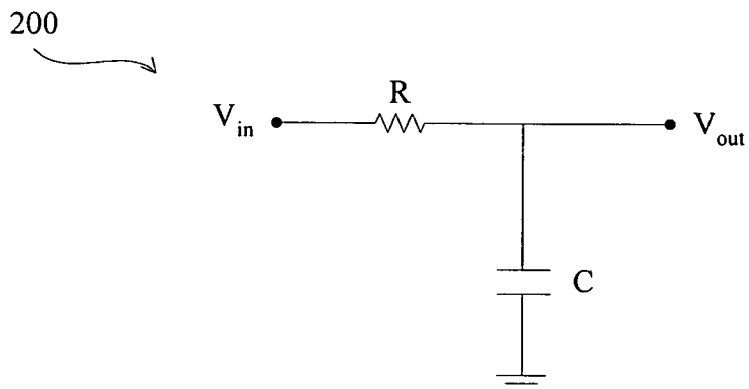
FIG. 2A is a circuit diagram illustrating a simple RC low pass filter which bandwidth is parasitic capacitance sensitive.

FIG. 2A is a circuit diagram illustrating a simple RC low pass filter 200, which bandwidth is parasitic capacitance sensitive. The filter 200 is formed by a resistor having a resistance R and a capacitor having a capacitance C, which is connected to ground. However, parasitic capacitance between $V_{out}$ to ground will be added up to the original capacitance C, so the bandwidth is parasitic sensitive. On the other hand for parasitic insensitive filters, parasitic capacitance will not affect the original design bandwidth. As derived in the equation below, the design cutoff frequency of the filter 200 is equal to $1/RC$. However, due to process variations in the manufacturing process, the actual cutoff frequency is $1/RC$ because the resistance and capacitance of the manufactured circuit often don't match the design specifications sent to the foundry.

Figure 2B:
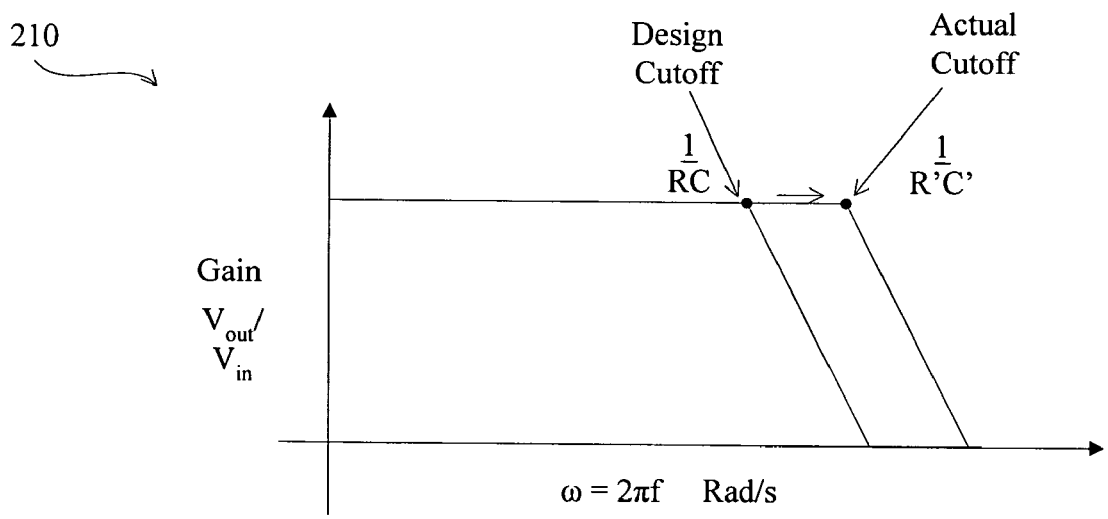
FIG. 2B is a chart illustrating a difference between the design cutoff frequency and actual cutoff frequency of the RC low pass filter.

FIG. 2B is a chart 210 illustrating the difference between the design cutoff frequency and actual cutoff frequency of the RC low pass filter 200. Up to a cutoff frequency, $\omega_o$, an LPF 330 will maintain constant gain. Above the cutoff frequency, the signal is attenuated. The cutoff frequency is based on the fact that gain is equal to Vout/Vin as derived below. However, the design cutoff frequency is often shifted from the actual cutoff frequency as shown in the chart 210.

$$\frac{V_{out}}{V_{in}} = \frac{\frac{1}{SC}}{R + \frac{1}{SC}} = \frac{1}{1+RSC} = \frac{1}{1+j\omega RC} = \frac{1}{1+j\frac{\omega}{\frac{1}{RC}}} = \frac{1}{1+j\frac{\omega}{\omega_o}}$$

Accordingly, per the equations above, adjusting the resistance and/or capacitance of the RC filter will adjust the cutoff frequency $\omega_o$, which can correct or calibrate for variation between the actual cutoff frequency and the design frequency. As will be discussed further below, a 5-bit calibration code 320 (FIG. 3) can be used to switch on and off capacitors in a capacitor array 420 (FIG. 4) of the LPF 330, which will vary capacitance and therefore the cutoff frequency.

Figure 3:
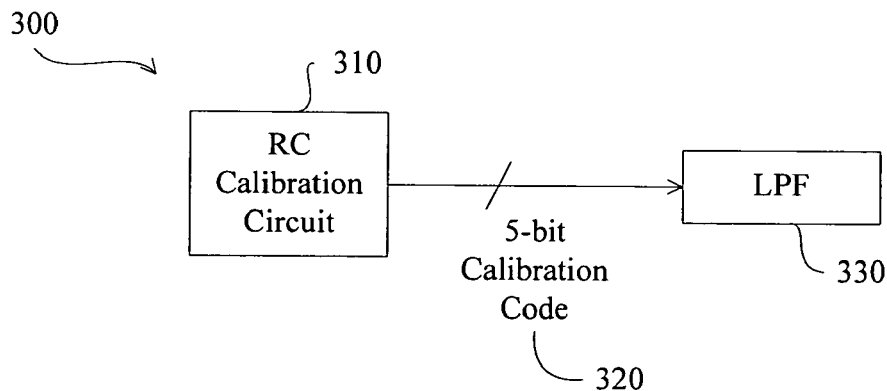
FIG. 3 is a block diagram illustrating a RC calibration circuit coupled to a low pass filter.

FIG. 3 is a block diagram illustrating a RC calibration circuit 300 coupled to the low pass filter (LPF) 330. In an embodiment of the invention, the LPF 330 includes an RC filter for filtering frequencies above a cutoff point. The cutoff point or bandwidth of the filter can be adjusted via the use of a 5-bit calibration code 320. It will be appreciated by one of ordinary skill in the art that other calibration control mechanisms can be used. In an embodiment of the invention, the RC calibration circuit 300 can be used for high pass filters or bandpass filters, which have different frequency responses from the LPF 330.

Figure 4:
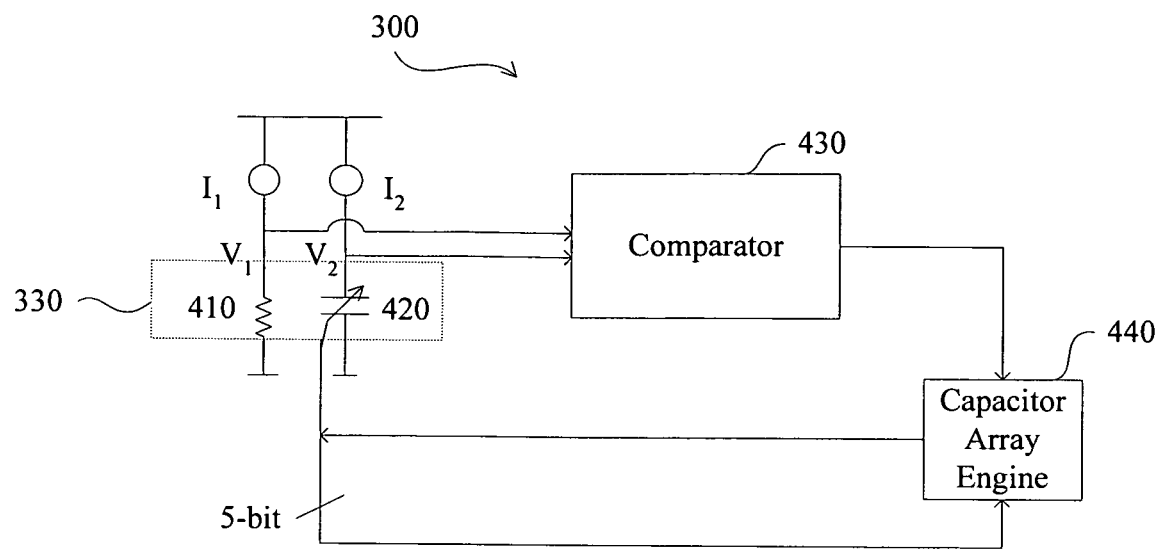
FIG. 4 is a block diagram illustrating the RC calibration circuit of FIG. 3.

FIG. 4 is a block diagram illustrating the RC calibration circuit 300 (FIG. 3). A resistor 410 and the capacitor array 420 (which form the RC-based LPF 330) are each coupled to a comparator 430, which is coupled to a capacitor array engine 440, which is coupled to the capacitor array 420. The comparator 430 receives and measures differences in voltages from the resister 410 and capacitor 420. The capacitor array 420 also provides feedback to the engine 440. Based on the measured difference in voltages and feedback, the capacitor array engine 440 generates a 5-bit code to change the capacitance of the capacitor array 420.

When the LPF 330 is properly calibrated, $V_1$ will equal $V_2$, i.e.:

$$V_1 = IR = V_2 = \frac{I\Delta T}{C}$$

therefore, $$RC = \Delta T$$

wherein R is resistance of the resistor 410, C is capacitance of the capacitor array 420, I is the current through the resistor 410 and capacitor array 420 ($I_1=I_2=I$), $v_1$ is the voltage at the resistor 410, $V_2$ is the voltage at the capacitor array 420, and $\Delta T$ is the time the capacitor array 420 is charged (e.g., a constant).

During operation of the circuit 300, the comparator 430 measures the difference in voltage between the capacitor array 420 ($V_2$) and the resistor 410 ($V_1$) and feeds this difference into the capacitor array engine 440. If there is a difference in voltage, the capacitor array engine 440 generates a 5 bit code 320 and transmits it to the capacitor array 420, which activates or deactivates some of the capacitors in the array 420 (see FIG. 5).

Each bit of the 5 bit code 320 activates a single capacitor of the capacitor array 420. In an embodiment of the invention, initially all activatable capacitors in the array 420 are inactive and the engine 440 can sequentially activate capacitors in the array 420 until $V_1=V_2$. In another embodiment of the invention, the engine 440 can randomly activate capacitors in the array 420 until $V_1=V_2$. In another embodiment of the invention, the engine 440 activates capacitors in the array 420 in proportion (or in inverse proportion) to the difference in voltage. It will be appreciated by one of ordinary skill in the art that other techniques for determining the number of capacitors to be activated or deactivated can be used. In another embodiment of the invention, the engine 440 adjusts the resistance of the resistor 410. In another embodiment of the invention, the engine 440 adjusts both the resistance of the resistor 410 and the capacitance of the capacitor array 420. For filter bandwidth that is insensitive to parasitic capacitance, the calibration circuit 300 can still determine the right bandwidth by adjusting resistance of the resistor 410 at the $V_1$ branch.

Figure 5:
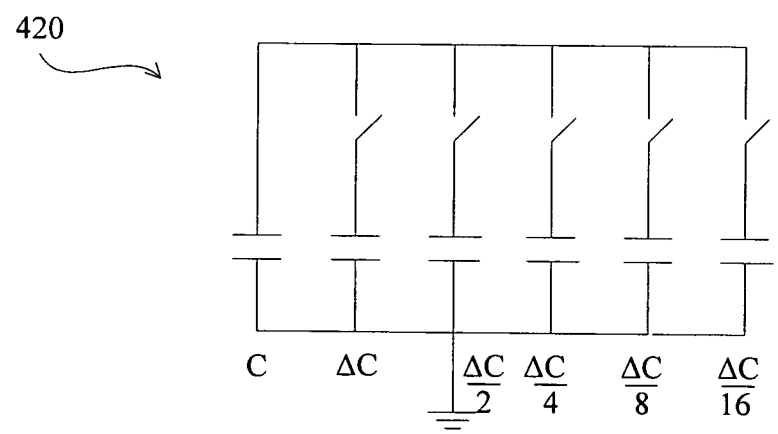
FIG. 5 is a block diagram illustrating a capacitor array of the RC calibration circuit.

FIG. 5 is a block diagram illustrating the capacitor array 420 of the RC calibration circuit 300. The capacitor array comprises 6 capacitors, 5 of which are activatable. Each capacitor of the array 420 can have the same capacitance or can have a difference capacitance as shown in FIG. 5. It will be appreciated by one of ordinary skill in the art that the array 420 can comprise additional or fewer capacitors. In an embodiment of the invention, the array 420 can comprise inductors in place of capacitors or a combination of inductors and capacitors.

Figure 6:
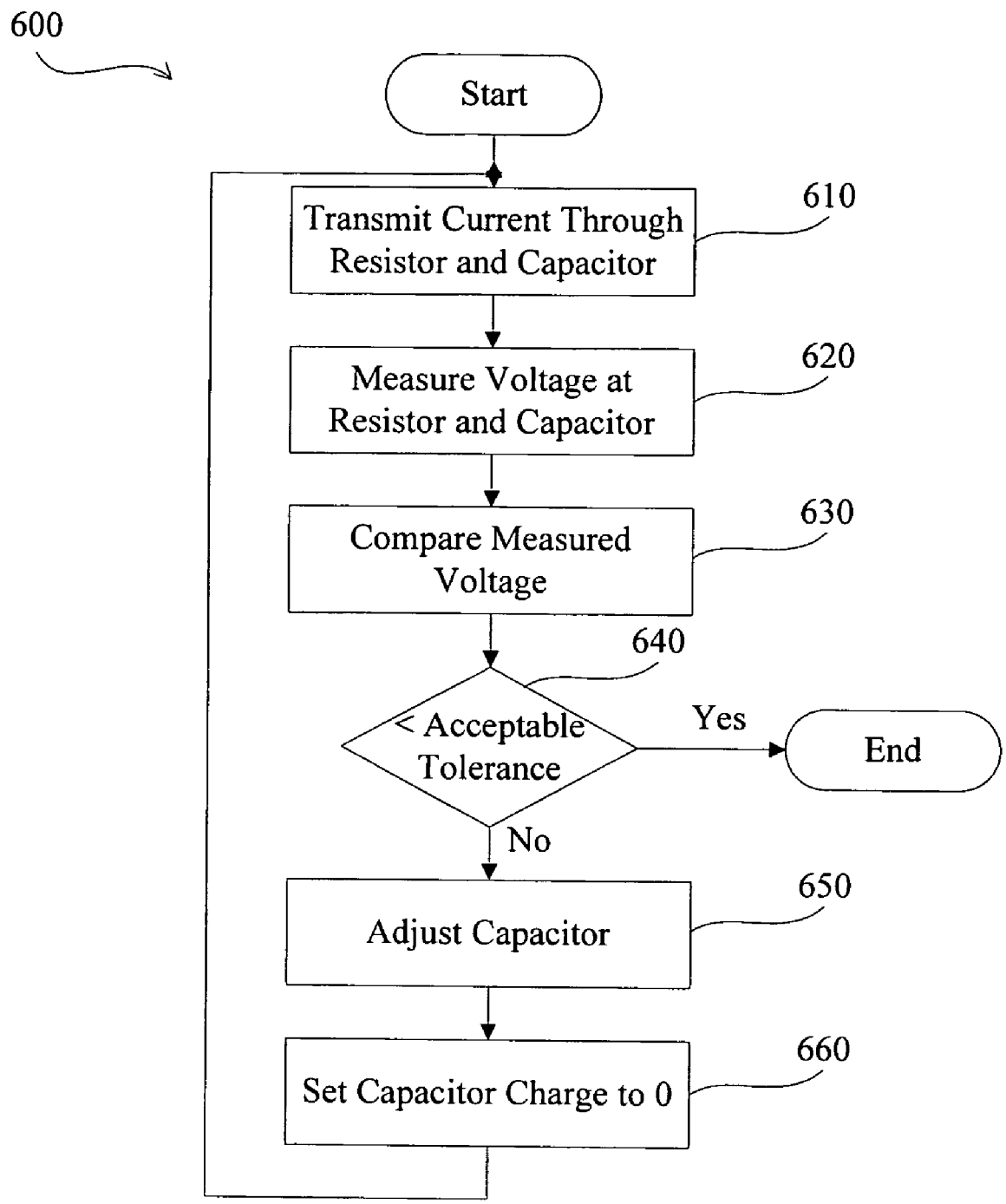
FIG. 6 is a flowchart illustrating a method of calibrating a filter to compensate for variation between a design cutoff frequency and actual cutoff frequency.

FIG. 6 is a flowchart illustrating a method 600 of calibrating the filter 330 to compensate for variation between a design cutoff frequency and actual cutoff frequency. First, currents $I_1$ and $I_2$, which are equal, are transmitted (610), respectively, through the resistor 410 and capacitor array 420. The voltage is then measured (620) and compared (630) at the resistor 410 and the array 420. If (640) there is no difference (e.g., less than an acceptable tolerance), then the method 600 ends. If (640) there is a difference in voltage (greater than an acceptable tolerance), then the capacitor array 420 is adjusted (650), the capacitance charge of the capacitors is set (660) to zero, and the method 600 is repeated.

It will be appreciated by one of ordinary skill in the art that the method 600 does not necessarily need to be executed in the order recited above as many of the subprocesses of the method 600 can be executed substantially simultaneously.

The foregoing description of the illustrated embodiments of the present invention is by way of example only, and other variations and modifications of the above-described embodiments and methods are possible in light of the foregoing teaching. Components of this invention may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

What is claimed is:

1. A method, comprising:
   measuring a difference in voltage between a first and second element of a filter when an equal current is applied to both elements; and
   adjusting at least one of the first or second elements if there is a measured difference in voltage, wherein the adjusting causes a characteristic of the filter to more closely match a design characteristic of the filter.

2. The method of claim 1, wherein the filter includes a low pass filter.

3. The method of claim 2, wherein the low pass filter includes an RC filter.

4. The method of claim 2, wherein the characteristic includes a cutoff frequency of the filter.

5. The method of claim 4, wherein the cutoff frequency matches the design cutoff frequency when there is no difference in voltage.

6. The method of claim 1, wherein the first element includes a capacitor array and the adjusting activates one or more of the capacitors in the array.

7. The method of claim 6, further comprising setting the charge of each capacitor in the array to zero and repeating the measuring and adjusting until the difference in measured voltage is less than a pre-specified tolerance.

8. The method of claim 1, further comprising repeating the measuring and adjusting until measured voltage is less than a pre-specified tolerance.

9. A system, comprising:
   means for measuring a difference in voltage between a first and second element of a filter when an equal current is applied to both elements; and
   means for adjusting at least one of the first or second elements if there is a measured difference in voltage, wherein the adjusting causes a characteristic of the filter to more closely match a design characteristic of the filter.

10. A system, comprising:
    a comparator capable of measuring a difference in voltage between a first and second element of a filter when an equal current is applied to both elements; and
    an engine, communicatively coupled to at least one of the first and second elements and communicatively coupled to the comparator, capable of adjusting at least one of the first or second elements if there is a measured difference in voltage, wherein the adjusting causes a characteristic of the filter to more closely match a design characteristic of the filter.

11. The system of claim 10, wherein the filter includes a low pass filter.

12. The system of claim 11, wherein the low pass filter includes an RC filter.

13. The system of claim 10, wherein the characteristic includes a cutoff frequency of the filter.

14. The system of claim 13, wherein the cutoff frequency matches the design cutoff frequency when there is no difference in voltage.

15. The system of claim 10, wherein the first element includes a capacitor array and the adjusting activates one or more of the capacitors in the array.

16. The system of claim 10, wherein the comparator and engine are further capable of repeating the measuring and adjusting, respectively, until there is the difference in measured voltage is within a pre-specified tolerance.

* * * * *